(12) United States Patent
Lojek

(10) Patent No.: US 6,486,031 B1  
(45) Date of Patent: Nov. 26, 2002

(54) METHOD OF MAKING AN EEPROM CELL WITH ASYMMETRIC THIN WINDOW

(75) Inventor: Bohumil Lojek, Colorado Springs, CO (US)

(73) Assignee: Atmel Corporation, San Jose, CA (US)

(*) Notice: Subject to any disclaimer, the term of this patent is extended or adjusted under 35 U.S.C. 154(b) by 0 days.

(21) Appl. No.: 10/053,473

(22) Filed: Nov. 2, 2001

Related U.S. Application Data

(62) Division of application No. 09/847,810, filed on May 1, 2001, now Pat. No. 6,369,422.

(51) Int. Cl.[7] .......................................... H01L 21/8247
(52) U.S. Cl. ...................................... 438/264; 438/286
(58) Field of Search .............................. 438/257–267, 438/286

(56) References Cited

U.S. PATENT DOCUMENTS

| | | | |
|---|---|---|---|
| 5,066,992 A | 11/1991 | Wu et al. ................... | 357/23.5 |
| 5,086,325 A | 2/1992 | Schumann et al. ......... | 357/23.5 |
| 5,094,968 A | 3/1992 | Schumann et al. .......... | 437/43 |
| 5,102,814 A | 4/1992 | Woo ........................... | 437/43 |
| 5,198,381 A | 3/1993 | Chang et al. ................ | 437/43 |
| 5,334,550 A | 8/1994 | McElroy et al. ............. | 437/65 |
| 5,379,253 A | 1/1995 | Bergemont ................ | 365/185 |
| 5,424,233 A | 6/1995 | Yang et al. .................. | 437/43 |
| 5,640,032 A | 6/1997 | Tomioka .................... | 257/316 |
| 5,861,333 A | 1/1999 | Lin ............................. | 438/258 |
| 5,889,304 A | 3/1999 | Watanabe et al. ........... | 257/321 |
| 5,904,524 A | 5/1999 | Smolen ....................... | 438/264 |
| 5,917,215 A | 6/1999 | Chuang et al. .............. | 257/321 |
| 5,936,274 A | 8/1999 | Forbes et al. ............... | 257/315 |
| 5,953,254 A | 9/1999 | Pourkeramati .......... | 365/185.26 |
| 5,972,752 A | 10/1999 | Hong .......................... | 438/264 |
| 5,973,356 A | 10/1999 | Noble et al. ................ | 257/319 |
| 6,063,667 A | 5/2000 | Kuo ............................ | 438/263 |
| 6,171,907 B1 | 1/2001 | Tuntasood ................. | 438/264 |
| 6,187,634 B1 | 2/2001 | McElheny et al. .......... | 438/263 |

*Primary Examiner*—Richard Booth  
(74) *Attorney, Agent, or Firm*—Thomas Schneck

(57) ABSTRACT

A nonvolatile memory cell is constructed with a charge transfer window have a charge transfer region smaller than the minimum resolution feature size of used to construct the cell. The window is constructed to the minimum feature size, but its layout position places it partly within the channel region of the cell and partly within a field oxide barrier wall. The part of the window that lies within the channel region does not reach across the width of the channel to an apposing field oxide barrier wall and does not reach along the length of the channel region to either of opposedly laid source and drain regions. The oxide within the window is evenly etched back to reveal the substrate within the channel region. A thin tunneling oxide is then grown within the window, including the part of the window encompassing the field oxide barrier wall.

20 Claims, 8 Drawing Sheets

METHOD OF MAKING AN EEPROM CELL WITH ASYMMETRIC THIN WINDOW

CROSS-REFERENCE TO RELATED APPLICATION

This is a divisional of application Ser. No. 09/847,810 filed May 1, 2001 now U.S. Pat. No. 6,369,422.

TECHNICAL FIELD

The invention relates to floating gate, nonvolatile, electrically alterable memory cells, and in particular to a miniaturized memory cell and method of making same.

BACKGROUND OF THE INVENTION

Nonvolatile memory cells typically use an oxide window to transfer charge to and from a floating gate. The logic state of the memory cell is determined by the presence or absence of charge of the floating gate. The transfer rate of charge to and from the floating gate is dependent on applied voltage potentials, on the relative size of the oxide window, the oxide window thickness, etc.

Nonvolatile memory cells require not just a reference high potential, Vcc supply voltage for operation, but also require at least one high program and erase voltage, Vpp, which is for example approximately 15–16 volts and typically two or three times the magnitude of Vcc. As integrated circuit devices such as cells comprising memory transistors and select transistors are scaled down, not only are the dimensions of their continuant elements reduced, but their applied voltages must also be reduced to maintain proper device operation and to not damage the scaled down device. In nonvolatile memory cells, the program and erase voltage Vpp cannot be reduced too much since it must remain above Vcc by some predetermined large margin. By designing a cell such that it requires a relatively high Vpp voltage in order to induce programming and erase operations, the chances of the cell being inadvertently programmed or erased by the standard Vcc voltage rail is reduced. This is especially true when small devices, which use a relatively low reference voltage Vcc1, are interfaced with large devices that used a relatively higher reference voltage Vcc2. If the higher reference voltage Vcc2 of the large devices is of comparable potential as the program and erase Vpp voltage of the smaller devices, then a memory cell of the smaller devices may have its data inadvertently altered. The program and erase Vpp voltage of the smaller devices must therefore remain a safe margin higher than Vcc1 or Vcc2.

As the dimensions of a cell are reduced, the effects of the reference voltages Vcc and Vpp are amplified. If the magnitude of Vcc and Vpp are not reduced, then the scaled down cell behaves as if a higher voltage were being applied resulting in a degradation in the cell's performance and reliability. In the case of nonvolatile memories, since the Vpp value of a scaled down memory cell remains relatively high, the affect of the charge transfer oxide window is magnified as the dimensions of the memory cell are reduced. For example, the amount of charge transfer per unit area of the oxide window may remain constant or even increase as the floating gate, control gate, and drain are reduced. This causes a non-uniform scaling of the memory cell resulting in a limited amount of permissible scaling. In order to compensate for the relatively stronger influence of Vpp, the dimensions of the oxide window should ideally be reduced further than the other elements of the cell. The minimum oxide window, however, is typically limited by the minimum feature size resolution of the manufacturing equipment being used to construct the memory cell. This places a finite limit on the minimum size achievable for the oxide window beyond which it may not be reduced.

Further complicating the construction of a scaled memory cell is the complicated structure of the cell itself. It is often desirable that the location of the oxide window be between a select transistor and a memory transistor. This requires many masking steps to form the cell, which compounds to the problem of the finite size of the oxide window when attempting to construct a scaled down nonvolatile memory cell.

With reference to FIG. 1, a nonvolatile memory transistor, which is an integral part of a memory cell, resembles a typical MOS transistor in that it includes a source region 11 and drain region 12 in a substrate 15. The area between the source 11 and drain 12 define the length dimension of the memory transistor's channel region. Characteristic of a stack gate, nonvolatile memory transistor is a control gate 21 over a floating gate 19 on gate oxide 23 overlying channel region 17 and partly covering the source 11 and drain 12 regions. Floating gate 19 is separated from a control gate 21 by an inter-poly oxide 25. More characteristic of electrically alterable nonvolatile memory cells in general is an oxide window 27 through which charge is transferred to and from floating gate 19. In essence, the dimensions of oxide window 27 define the size of the cell's charge transfer region. As will be explained below, this characteristic is an obstacle to the construction of a memory cell of minimum feature size.

With reference to FIG. 2, a cross-sectional view along lines 2—2 of FIG. 1 shows that the transistor is constructed between two opposing field oxide regions 29. The separation between field oxide regions 29 defines the width direction of the memory transistor. Floating gate 19 is shown to span the width of the channel region and to partly cover field oxide region 29. Similarly, control gate 21 is implemented as a polysilicon strip extending perpendicular to the length of the memory transistor. Oxide window 27, which in this case overlays drain region 12, extends from one field oxide region 29 to the other.

This cell architecture, which is more fully recited in U.S. Pat. No. 5,086,325 assigned to the assignee of the present invention, simplifies construction of the memory transistor of a cell by having the width of the oxide window defined by the minimum spacing between field oxide regions 29. This architecture has traditionally resulted in a cell of compact size, but as cells sizes are further reduced, it becomes necessary to bring field oxide regions 29 even closer together to maintain proper scaling performance. It has been found, however, that as field oxide regions 29 are brought very close together, oxide buckling that can distort the window oxide may occur. This can lead to premature failure of a cell, and thus poses a limitation to the amount of scaling permissible with this architecture.

With reference to FIG. 3, U.S. Pat. No. 5,904,524 addresses this problem by removing its oxide window 31 out from between the field oxide regions 33 and 35 that define the width of the cell channel. The cell is defined by three active areas 41, 43, and 45. The source, drain, and channel regions of the memory cell are within active area 43, the control gate 47 is coupled to floating gate 49 in active area 41, and floating gate 49 overlies the channel region in active area 43, and overlies the oxide window 31 in active area 45. Since the channel area is in active area 43 and the oxide window 31 is not in active area 43, field oxide regions 33 and 35 may be brought closer together to form a small width channel without causing buckling of oxide window 31. The '524 patent explains that this permits easier scaling of the memory cell since oxide window 31 is no longer affected by the narrowing of the cell channel width. This cell architecture, however, requires three adjacent active areas 41, 43, and 45 isolated by interposed field oxide regions 33 and 35, and is therefore not a very compact architecture.

With reference to FIG. 4, a different cell architecture discussed in U.S. Pat. No. 5,066,992 and assigned to the assignee of the present invention shows a memory cell with one side of its oxide window 51 aligned to floating gate 53 and control gate 55. The width of oxide window 51 still extends across the width of the channel such that miniaturization of the cell is still limited by the how close the surrounding field oxide regions, not shown, may be brought together. However, the length of oxide window 51 is adjusted by the placement of floating gate 53 and control gate 55. This is because floating gate 53 is formed by the use of a mask which defines the floating gate 53 and oxide window 51 beneath it to self align oxide window 51 into position. This process facilitates scaling of the cell, and specifically facilitates scaling of the oxide window in the length-wise direction.

A similar approach is shown in U.S. Pat. No. 5,953,254 with the exception that its oxide window does not extend across the whole width of the cell to contact both of the opposing field oxide regions. The '254 patent explains that one can obtain improved capacitive coupling for a floating gate if the oxide window is not bounded by either field oxide regions, but this necessarily increases the allowable distance between the field oxide regions since they must be maintained separated from the oxide window. This approach is in opposition to the need to bring opposing field oxide regions closer together in order to reduce the width dimension and maintain proper scaling performance.

U.S. Pat. No. 5,972,752 shows a nonvolatile memory cell whose oxide window can be made smaller than would otherwise be possible by the minimum feature size resolution of the manufacturing equipment being used. It is explained that this permits the oxide window to be scaled down to achieve a smaller cell. With reference to FIG. 5, the '752 memory cell has a source region 61, a drain region 63, and a channel region 65 therebetween. A floating gate 67 and a control gate 69 cover channel region 65 and partly overlay riser blocks 71. Gate oxide 75 includes an oxide window 77, which extends across the width of the cell from one field oxide region, not shown, to an opposing field oxide region, not shown. The length of oxide window 77, however, can be made smaller than the minimum size resolution of the manufacturing equipment by using riser blocks 71 to construct a highly controlled mask for the oxide window.

With reference to FIG. 6, the '752 patent explains that riser blocks 71 are first laid over source and drain regions 61 and 63. Oxide 73 is then grown on the exposed surfaces, including the exposed sides of riser blocks 71 and the exposed surface of substrate 79. The structure is then blanketed with a thick insulative material that is etched down to form sidewall spacers 81. The sidewall spacers 81 cover most of oxide layer 73 in channel region 65, but a narrow area of oxide layer 73 is exposed between sidewall spacers 81. This narrow strip of oxide is etched back to form oxide window 77. In FIG. 7, sidewall spacers 81 are removed, and first and second polysilicon layers 67 and 69 a laid. These polysilicon layers are then etched to construct the floating gate 67 and control gate 69 shown in FIG. 5.

Although the '752 cell achieves an oxide window having a dimension, i.e. its length, smaller than that achievable by the minimum feature size resolution of the equipment, it requires a much more complicated manufacturing processes. Furthermore, the riser blocks necessary for achieving the scaled down oxide window results in a memory cell of irregular profile, which can further degrade the integrity of the cell as the number of manufacturing process layers are increased. Additionally, it does not address the deterioration of the oxide window resulting from the need to bring the isolation oxide regions closer together to scale down the width of the cell.

It is an object of the present invention to provide a memory cell architecture that permits the easy scaling down of its charge transfer region without requiring complicated process steps.

It is an object of the present invention to provide a method of constructing a memory cell that permits the isolating field oxide regions, which define the width of a cell, to be brought closer together for proper scaling while not deteriorating the oxide window.

It is another object of the present invention to provide a method of constructing a memory cell having a charge transfer region with dimensions smaller than those achievable by the minimum feature size resolution of the manufacturing equipment used to construct the cell.

SUMMARY OF THE INVENTION

The above objects are met in a method of making a nonvolatile memory cell structure wherein the size of its oxide window remains finite, but the part of the oxide window through which charge is transferred may be reduced to a size smaller than the minimum feature size resolution of the manufacturing equipment being used. This is accomplished by positioning the fixed-size oxide window in such a manner such that it does not extend across the width of the cell from one field oxide region to another, and whose position controls the amount of charge allowed to be transferred through it. This is accomplished by constructing the oxide window such that a first part of it lays over only one of the two opposing field oxide window regions and its remaining part lays within the channel region, but does not extend across it. This effectively creates a slit in the oxide window, and the size of the slit may be adjusted by moving the position of the oxide window. All parts of the oxide window constructed over the field oxide region cannot be used for transferring charge to the floating gate. Only the part of the oxide window that lies within the channel region may be used to charge transfers. Thus, one can construct an effective charge transfer region that is smaller than the oxide window, and thus smaller than otherwise possible by the minimum feature size resolution of the manufacturing equipment. In this manner, the relatively fixed size of the oxide window does not affect the scaling of the nonvolatile cell since only a small part of the oxide window is used for charge transfer. Additionally, since the oxide window does not reach across the opposing field oxide regions, one may bring the field oxide regions closer together without causing much ill effect to the charge transfer section of the oxide window.

The arranging of the oxide window is established by noting that the oxide window has a generally rectangular shape. Typically, the longer side of this rectangle would be used to reach across the width of the nonvolatile cell, and the shorter side of the rectangle would be aligned along the length of the cell. In order maintain proper control of the charge transfer section of the cell, however, the preferred embodiment turns the oxide window by ninety degrees such that the longer side is aligned along the length of the cell and the shorter side is aligned along the width of the cell. In this manner, the shorter side of the oxide widow does not reach across the width of the channel and the field oxide regions may be brought closer, as required.

BEST MODE FOR CARRYING OUT THE INVENTION

Figure 8:
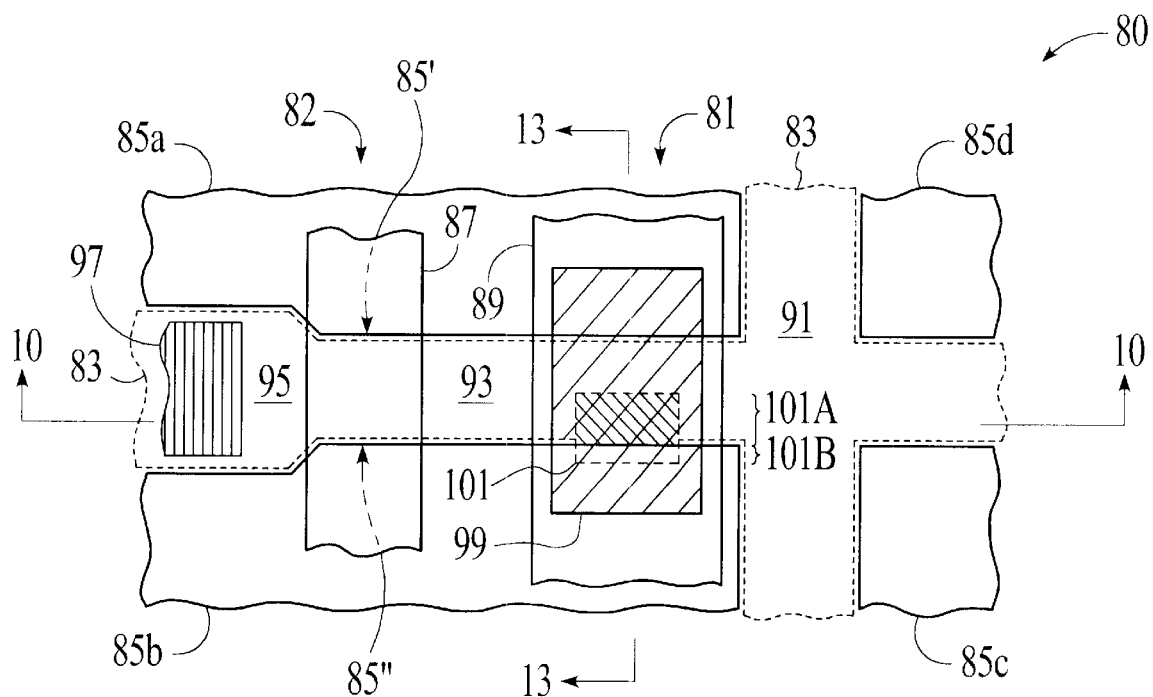
FIGS. 8 and 9 show layout views of a memory cell in accord with the present invention.

With reference to FIG. 8, a top layout view of a nonvolatile memory cell 80 in accord with the present invention is shown. In the present example, the memory cell is shown to comprise a memory transistor 81 in series with a select transistor 82. The active area of the memory cell is symbolically outlined by dashed line 83. As it is known in the art, the active area of an IC is defined as the surface areas of the substrate where active devices, i.e. circuit elements such as transistors and resistors, are formed. The active areas are surrounded by insulative field oxide regions 85a–85d that act as barrier walls to provide electrical isolation between the active areas 83. Many forms of field oxide 85 are known in the art, but the presently preferred architecture implements local oxidation of silicon, or LOCOS, field oxide regions 85. It is to be understood that other field oxide architectures, such as shallow trench isolation (STI), are likewise suitably appropriate depending on device requirements.

As shown, polysilicon strips 87 and 89 cross parts of active area 83 and overlay field oxide region 85. Typically, a polysilicon strip functions as the control gate of a transistor and the uncovered active areas on either side of the polysilicon strip function as the source and drain of the transistor after appropriate doping of the active areas. In the present example, polysilicon strip 89 forms the control gate of memory transistor 81 and polysilicon strip 87 forms the control gate of select transistor 82. Similarly, section 91 of active area 83 functions as the source of memory transistor 81 and section 95 of active area 83 functions as the drain of select transistor 82. Shaded region 97 within drain area 95 denotes the location of a contact. Section 93 of active area 83 functions as the drain of memory transistor 81 and as the source of select transistor 82. Under polysilicon strips 87 and 89, the opposing boundaries of field oxide regions 85a and 85b define the widths of select transistor 82 and memory transistor 81. The opposing boundaries of field oxide regions 85a and 85b are indicated by arrows 85' and 85", respectively.

The active region under control gate 89 constitutes the channel region of memory transistor 81. Similarly, polysilicon strip 87 is separated from active area 83 by a gate oxide, and the active area under polysilicon strip 87 constitutes the channel region of select transistor 82. Memory transistor 81 further includes an insulated floating gate 99 under polysilicon strip 89. Floating gate 99 is also made of polysilicon and is considered to be floating since it is enclosed in insulative oxide such that it is prevented from direct, physical and electrical contact with its adjacent conductive components. For example, its upper side is insulated from polysilicon strip 89 by an inter-poly oxide, not shown, its side ends are insulated by the field oxide regions 85, which it overlays, and its underside is insulated from active region 83 by a gate oxide.

As explained above, data is stored in memory transistor 81 by the moving charge into and out of floating gate 99, and since floating gate 99 is enclosed, a controllable passageway must be constructed to gain access to the otherwise isolated floating gate 99. This controllable passageway is in practice called a "window" and is typically constructed in the gate oxide under floating gate 99. The window is constructed by outlining frame region within the gate oxide and thinning the oxide within the frame or forming a thin oxide within the frame. The oxide within the frame is made thin enough such that it retains its insulative qualities, but its electric field barrier can be overcome by the application of a large electric field, Vpp, without too much damage to the oxide window 101. Charge is controllably moved into, and out off, the floating gate 99 through this thin oxide window 101 by the appropriate application of Vpp. The construction of oxide window 101 is of particular interest in the present invention.

Oxide window 101 poses a problem when trying to scale down the size of nonvolatile memory cell 80 in general, and nonvolatile transistor 81 in particular. The amount of charge that is moved through an oxide window is dependent on several factors including the thickness of the oxide window, its area, and the voltage potential across it. For example, if the drain-to-source voltage of a transistor remains unchanged while its channel length dimension is reduced, the average electric field along the shortened channel will be larger leading to a loss in gain and an increase in hot-carrier effects. Additional problems of electron migration and punch-through failure may also occur. Therefore, a rule of device scaling is that the applied voltages should be reduced along with the reduction of device dimensions. In other words, the values of Vcc and Vdd should be reduced as the device is scaled down. Otherwise, the device's performance will be degraded and the device itself may be damaged.

Unfortunately, the voltage applied across an oxide window can typically not be scaled down as much as would be desired in order to maintain compatibility with other parameter scaling. Since Vpp remains relatively high compared to the scaled down physical dimensions of the nonvolatile transistor, such as its width, length, oxide window thickness, floating gate size, etc, it is necessary to compensate for the relatively larger electric field by reducing the area of the oxide window even more than would otherwise be required if Vpp were allowed to be lowered in proper proportion to the scaling of the transistor's physical dimensions and charge concentrations. Reducing the size of the oxide window limits the amount of charge transfer through it and thus compensates for the comparatively higher electric field of the relatively large Vpp value. Decreasing the tunneling oxide area beneath the floating gate also increases the capacitive coupling ratio. For a memory cell having a high coupling ratio, the speed of transfer of the electrons from the floating gate to the source/drain region is fast therefore providing better programming properties. The minimum size of oxide window 101, however, is limited by the minimum feature size resolution of the manufacturing equipment used in construction of memory cell 80.

Additionally, as the dimensions of nonvolatile transistor 81 are reduced, it becomes necessary to reduce its channel width dimension. As stated above, the width of nonvolatile memory transistor 81 is defined by the opposing field oxide regions 85a and 85b. Therefore, field oxide regions 85a and 85b need to be brought closer together as transistor 81 is scaled down in order to reduce its width. As was explained above, however, the quality the field oxide window can be degraded if it spans across from one opposing field oxide region 85a to the other 85b and the field oxide walls 85a and 85b are brought too close together.

The present invention solves both of the above problems by altering the layout of oxide window 101. The required scaled size of the oxide window is smaller than the minimum feature size resolution of the manufacturing equipment used to produce nonvolatile transistor. This is because the physical dimensions of nonvolatile memory transistor 81 are typically scaled down to the limitations of the manufacturing equipment. For example, it is desirable that the channel length of a transistor be set to the minimum feature size resolution of the manufacturing equipment, and that all other parameters be scaled accordingly using the minimum channel length as the scaling reference. As explained above, to maintain proper operation, it is necessary that oxide window 101 be smaller than the scaled down factor of the memory transistor. Since the scaled down factor of the transistor is based on the scaled channel length, and the scaled channel length is to the minimum feature size resolution of the manufacturing equipment, it follows that the oxide window requires dimensions smaller than the minimum feature size resolution of the manufacturing equipment. However, oxide window 101 is defined as a thin region of oxide, and the minimum size of this thin region of oxide 101 is limited to a fixed value determined by the minimum feature size resolution of the manufacturing equipment.

To compensate for oxide window 101 having a minimum size limited to a fixed value larger than the that required for proper scaling, the present invention arranges the placement of oxide window 101 such that a first zone 101A of oxide window 101 extends partly into the channel region of memory transistor 81 and a second zone 101B lies over field oxide region 85b. The first zone 101A constitutes a charge transfer region and the second zone 101B constitutes a non-charge transfer region 101B of oxide window 101. Oxide window 101 contacts only one field oxide region 85b such that it is not badly affected by bringing opposing field oxide regions 85a and 85b closer together during the scaling of the width of memory transistor 81. Furthermore, charge transfer region 101A lies entirely within the channel region of memory transistor 81 and make no contact with either source region 91, drain region 93, or opposing field oxide region 85A. Although oxide window 101 still has a relatively large size limited by the minimum feature size resolution of the manufacturing equipment, the effective size of oxide window is reduced by limiting the area of its charge transfer region 101A. The non-charge transfer region 101B of oxide window 101 cannot transfer charge since it resides entirely within insulative, field oxide region 85b. If it is desired that the charge transfer region 101A of field oxide window 101 be further reduced, then field oxide window 101 may be shifted more toward field oxide region 85b. Similarly, if it is desired that charge transfer region 101A be increased then oxide window 101 may be shifted more toward opposing field oxide region 85A, but it is preferred that oxide window 101 not make contact with opposing field oxide region 85a. It is to be understood that the exact area of charge transfer region 101A may not be perfectly determined. This is because the position of oxide window 101A may vary slightly due to alignment errors. However, it is typical to take these misalignments into account when designing the layout of a cell, and the resultant structure will remain within the spirit of the present invention. It should also be noted that charge transfer window 101 has a rectangular shape with the longer side parallel to the length dimension of the transistor. The shorter side of the oxide window is parallel to the width dimension of the channel. This facilitates the placing of the oxide window without spanning the width of the channel.

Figure 9:
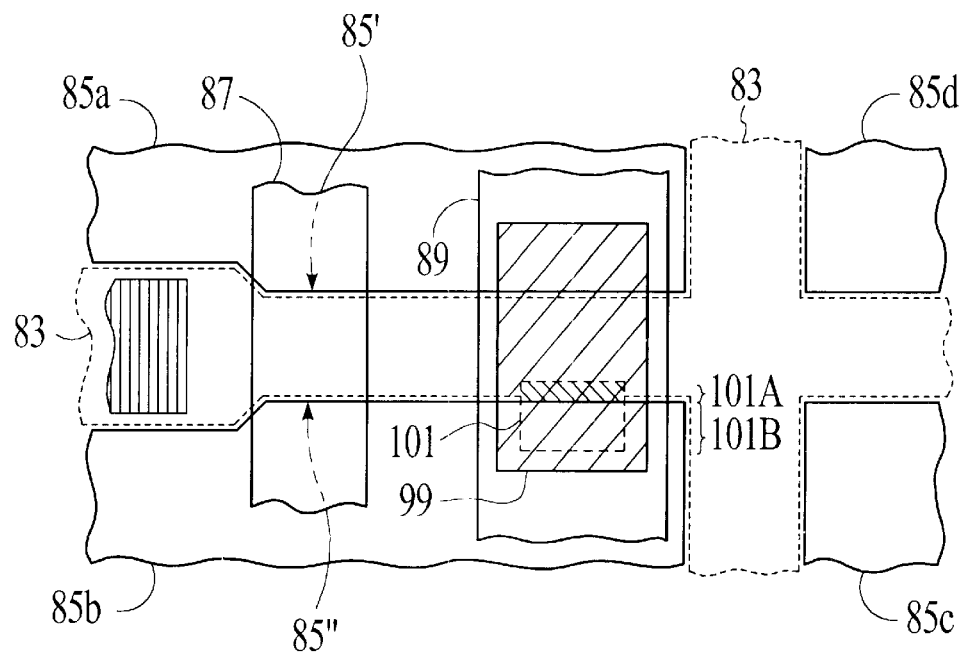

With reference to FIG. 9, all elements similar to those of FIG. 8 have similar reference characters and are described above. In this example oxide window 101 is moved closer to field oxide 85b resulting in a smaller charge transfer region 101A. Thus, the physical parameters of nonvolatile memory cell 80 may be scaled down further without confronting any limitations from the minimal size achievable of oxide window 101.

Figure 10:
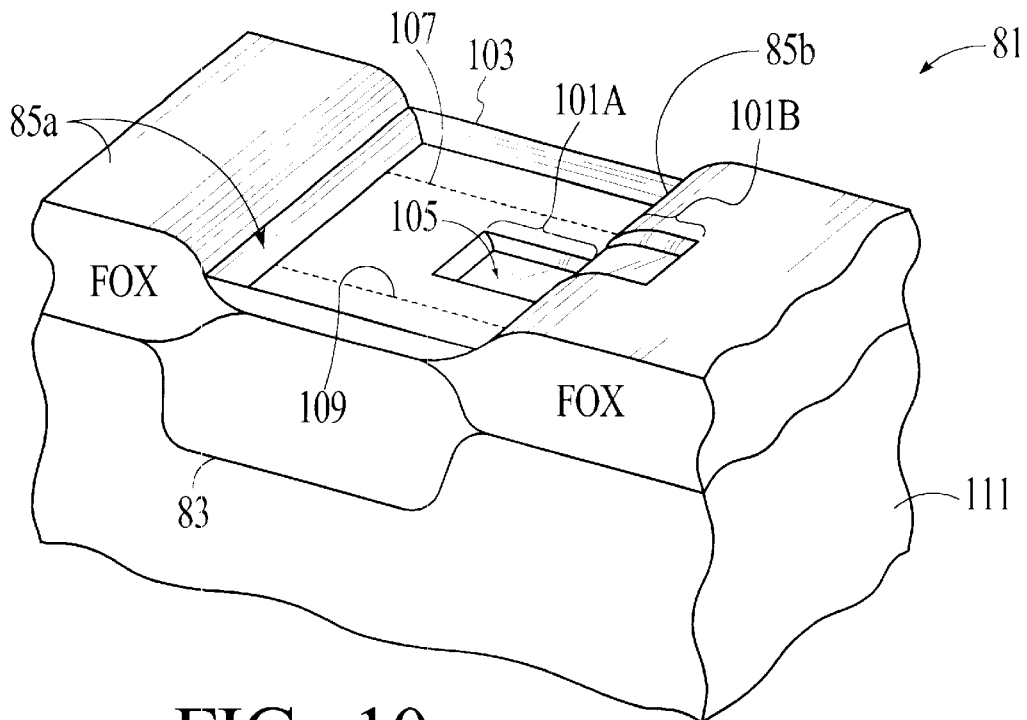
FIG. 10 is perspective view of a partially constructed memory cell in accord with the present invention.

With reference to FIG. 10, a perspective view of a partially constructed memory transistor 81 in accord with the present invention is shown. All elements similar to those of FIG. 8 are identified by similar reference characters and are described above. Active area 83 is shown to include a doped region defused into substrate 111. This doped region is optional and typically included to adjust the threshold voltage of a transistor and help shape the electric field within the active area. Field oxide regions 85a and 85b, which define the width dimension of active region 83 are not drawn to scale, but are shown to illustrate their LOCOS construction characterized by a narrowing of field oxide region to a point at the boarder of active region 83. This narrowing of field oxide regions 85 is typically referred to as a bird's beak. Gate oxide 103 is shown over active region 83. As was indicated in FIG. 8, gate oxide 103 separates floating gate 99, from the channel region defined by the surface of active region 83. Dash lines 107 and 109 indicates any encroachment of source region 91 and drain region 93, respectively, into the channel region under gate oxide 103 due to diffusion during various heating stages of the manufacturing process.

As shown, oxide window 101 partly lies within the channel region of active region 83 and partly over field oxide region 85b. Oxide window 101 is characterized by an etching process, (such as a wet etch, dry etch or combination etch) that thins the oxide of gate oxide 103 and field oxide region 85b within a target frame region, and then builds a thin layer of oxide in the target frame region. The part of oxide window 101 that lies within the channel region is its charge transfer region 101A. This is characterized by a thin oxide 105 of preferably less than 80 angstroms, and suitable for Fowler-Nordheim tunneling of charge. The part of oxide window 101 that lies within field oxide region 85*b* is its no-charge transfer region 101B.

Figure 11:
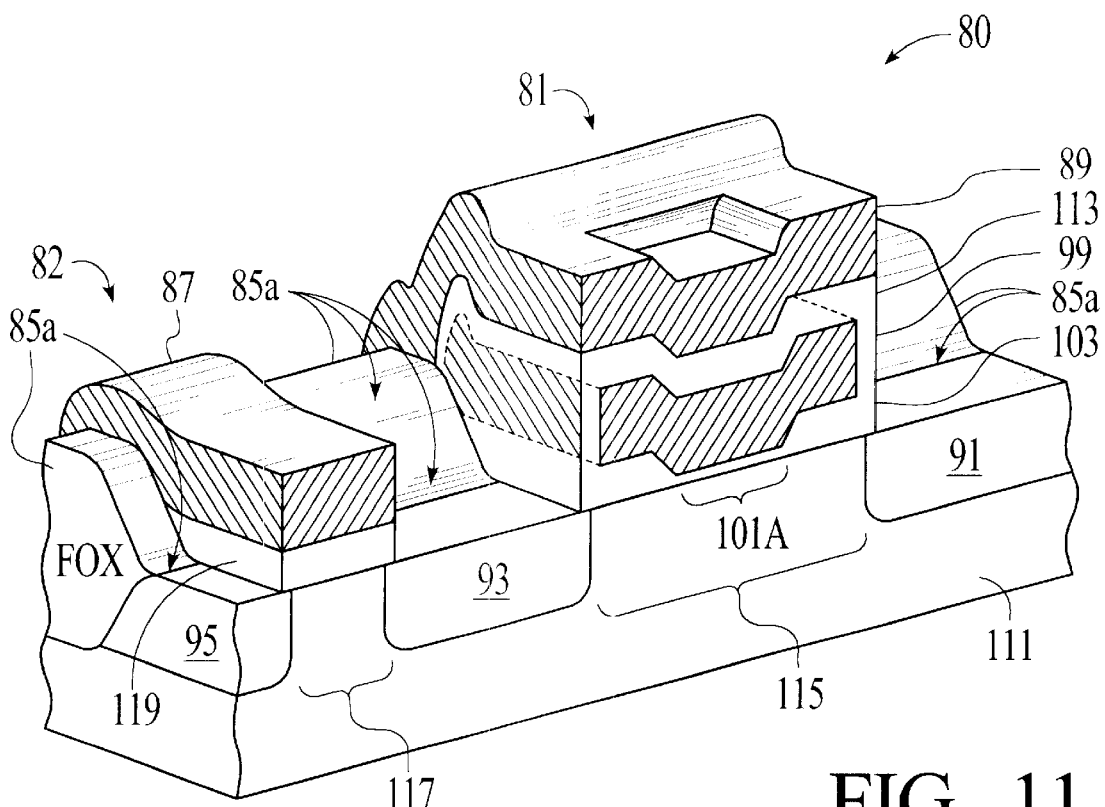
FIG. 11 is a perspective view of a memory cell in accord with present invention incorporating a select transistor.

With reference to FIG. 11, a cross-sectional, perspective view of the memory cell 80 of FIG. 8 taken along arrows 10 is shown. Channel region 115 is under gate oxide 103, which is under floating gate 99. Channel region 117 is under gate oxide 119, which is under control gate 87. Within gate oxide 103, charge transfer region 101A is shown characterized by thin region of oxide. This forms an indentation in gate oxide 103 that is propagated along the layers that overlay charge transfer region 101A. For example, floating gate 99, interpoly oxide 113 and control gate 89 show a similar indentation in their structure. In following the illustrative layout of FIG. 8, memory cell 80 of FIG. 11 shows floating gate 99 partly overlaying field oxide region 85*a*, and control gate 89 extending over and beyond field oxide region 85*a*. Similarly, control gate 87 of select transistor 82 also extends over and beyond field oxide region 85*a*. Additionally, conductive region 91, 93 and 95 are shown as consisting of doped regions within substrate 111. If desired charge transfer region 101A may contain an appropriate implant in order to increase the concentration underneath the tunneling oxide.

Figure 12:
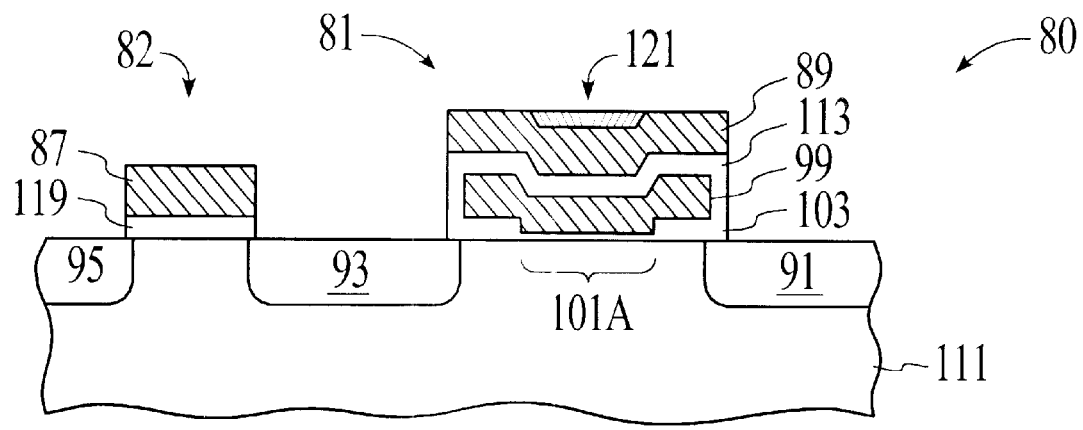
FIG. 12 is cross-sectional view of memory cell of FIG. 8 taken along lines 10—10.

With reference to FIG. 12, a cross-sectional view of the memory cell of FIG. 11 is shown. All elements similar to those of FIG. 11 have similar reference characters and are described above. Memory cell 80 is shown to consist of nonvolatile transistor 81 in series with select transistor 82. Region 91 preferably functions as the source region of nonvolatile transistor 81, and region 95 functions as the drain region of select transistor 87. Region 93 functions as the drain region of nonvolatile transistor 81 and as the source region of select transistor 82. FIG. 12 emphasizes the stack structure of nonvolatile transistor 81. The charge transfer section 101A of the oxide window is shown to reside completely within the channel region defined by floating gate 99 and control gate 89. Additionally, it is shown that oxide window 101 constructs an indentation 121 in the stack layers of gate oxide 103, floating gate 99, interpoly oxide 113 and control gate 89. The indentation results from the charge-transfer section 101A of the oxide window. Interpolyoxide 113 may comprise a dielectric film or a combination of dielectric films.

Figure 13:
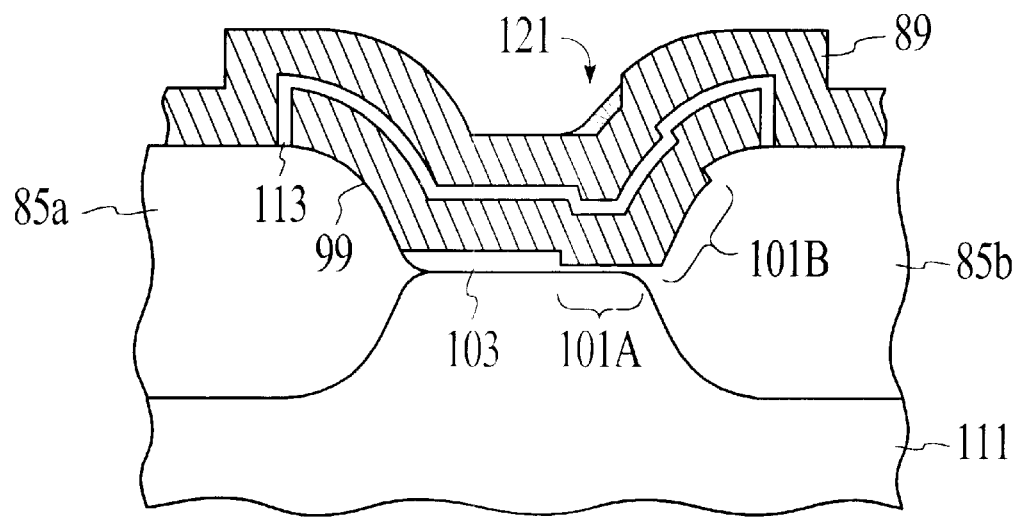
FIG. 13 is cross-sectional view of memory cell of FIG. 8 taken along lines 13—13.

FIG. 13 shows a cross-sectional view of the memory cell of FIGS. 8 and 11 along arrows 13—13. This view better emphasizes the structure of oxide window 101. As shown, control gate 89 spans over opposing field oxide regions 85A and 85B. Similarly, floating gate 99 partly spans from field oxide region 85A to field oxide region 85B and is isolated from control gate 89 by interpoly oxide 113. Gate oxide 103 separates floating gate 99 from the active channel region within substrate 111. As shown, oxide window 101 consists of a first charge transfer region 101A separating floating gate 99 from the channel region, and second non-charge transfer region 101B partly spanning field oxide region 85B. Oxide window 101 results in an indentation 121 that propagates the stack consisting of gate oxide 103, floating gate 99, interpoly oxide 113 and control gate 89.

Figure 1:
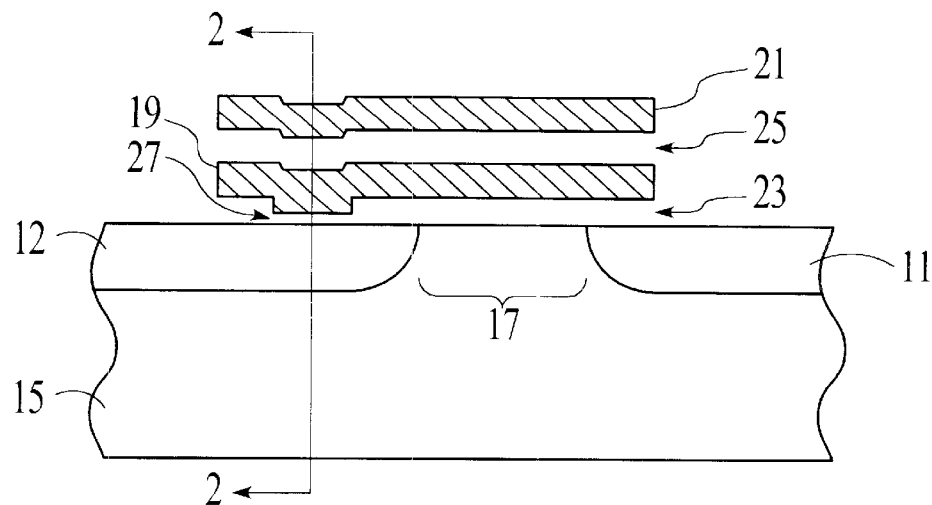
FIG. 1 is a cross-sectional view of a prior art stack gate, nonvolatile memory cell.
Figure 2:
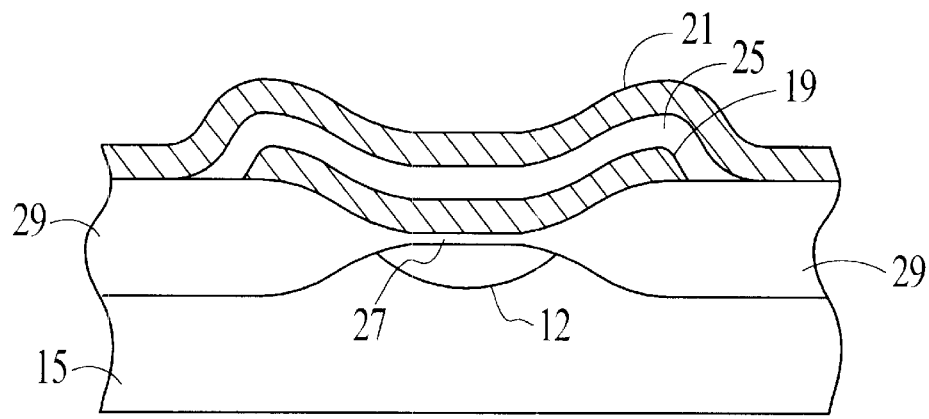
FIG. 2 is a sectional view along lines 2—2 of the prior art nonvolatile memory cell of FIG. 1.
Figure 4:
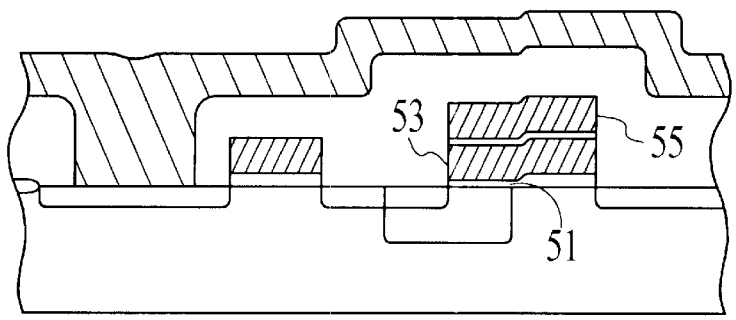
FIG. 4 is a cross-sectional view of prior art memory cell incorporating a select transistor.
Figure 3:
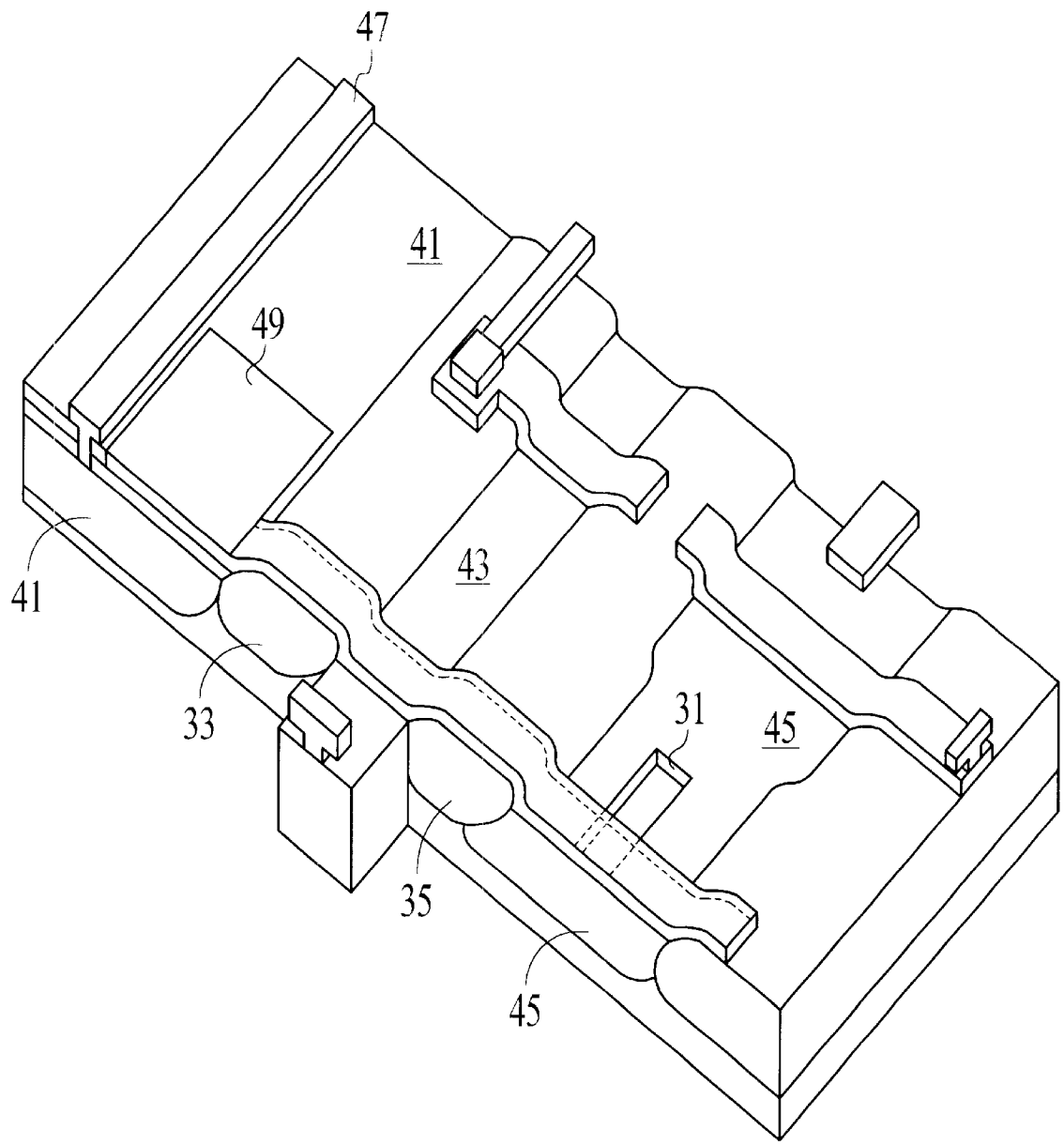
FIG. 3 is a perspective view of another prior art memory cell.
Figure 5:
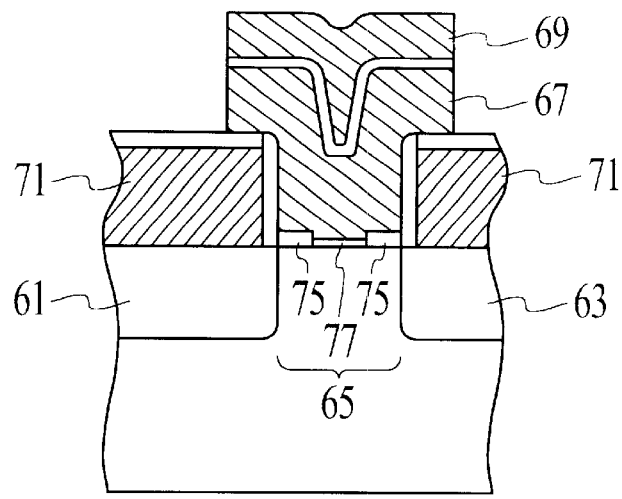
FIGS. 5 through 7 show various process steps in the construction of a prior art memory cell having a tunnel oxide with a length smaller than that achievable with the minimum resolution of the manufacturing equipment used to construct the memory cell.
Figure 6:
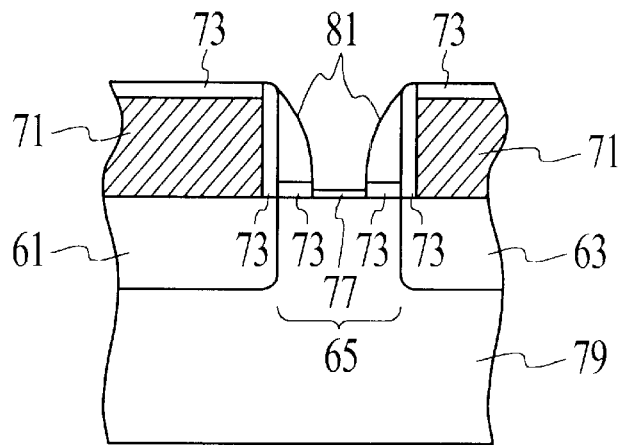
Figure 7:
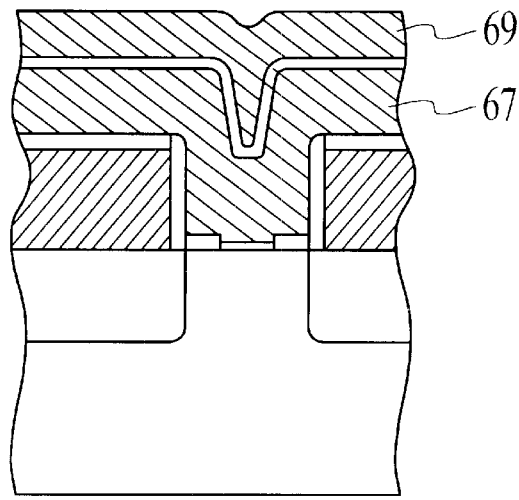

FIGS. 14 through 19 show various process steps in the construction of a nonvolatile transistor in accord with the present invention. In FIGS. 14 through 19, the designation "A", such as in FIG. "14A", indicate a view along arrows 13—13 of FIG. 8, and a designation "B", such as in "FIG. 14B" indicates a view along arrows 10—10 of FIG. 7.

Figure 14A:
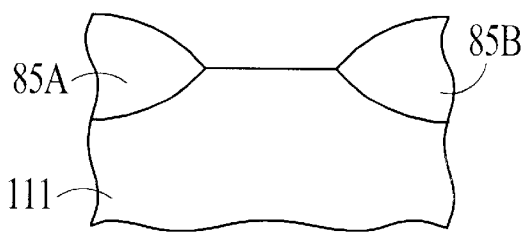
FIGS. 14 through 19 show various process steps in the making of a memory cell in accord with the present invention.
Figure 14B:
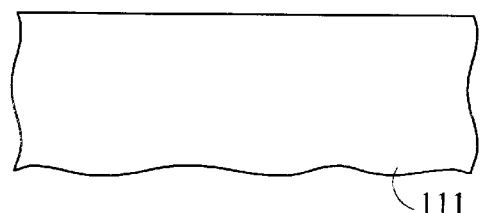

With reference to FIG. 14, after cleaning and polishing the surface of substrate 111, and constructing any required well structures, field oxide regions 85 are constructed. If desired, a buried N+ region, not shown, may be constructed within substrate 111. A cell implant may then be implemented to define the active regions. Preferably the cell implant consists of 75As+8.5E11 at 80 KeV and a 7 degree angle with no rotation.

Figure 15A:
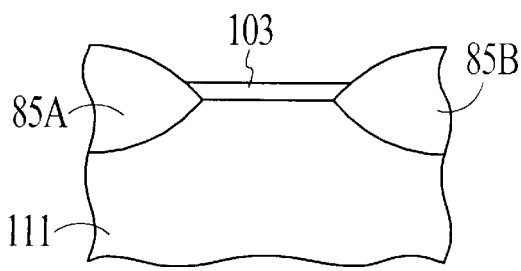
Figure 15B:
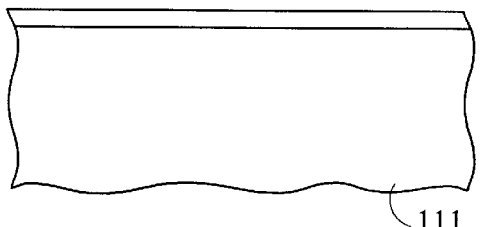
Figure 16A:
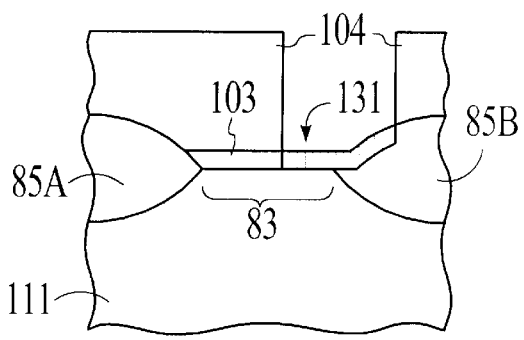
Figure 16B:
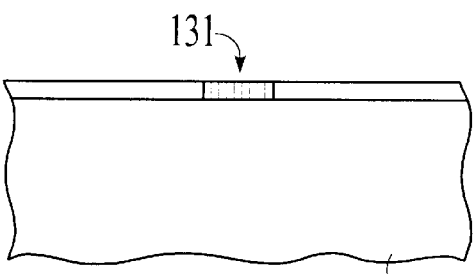

In FIG. 15, cell oxide, or gate oxide, 103 is constructed to a preferred thickness of 390 Å. The surface is then subjected to a wet etch step to form an opening 131 in gate oxide 103 down to substrate 111, as shown in FIG. 16. The shape and location of opening 131 may be defined by means of a resist 104 of a masking step. Opening 131 extends from active region 83 to field oxide region 85D.

Figure 17A:
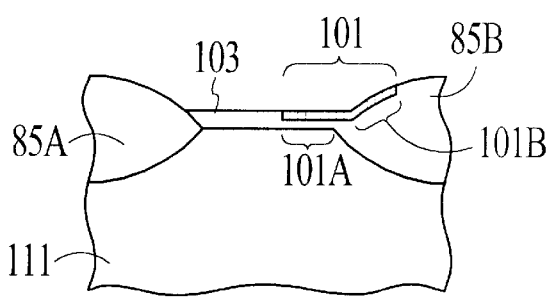
Figure 17B:
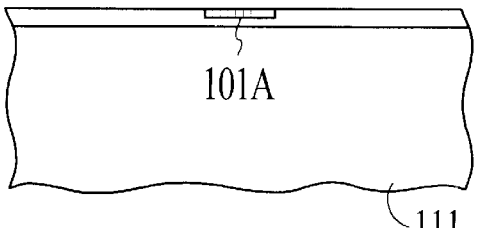

With reference to FIG. 17, a thin layer of oxide is then grown in opening 131 to form oxide window 101. The thin layer has a preferred thickness of about 76 Å. As explained before, oxide window 101 consists of a first charge transfer region 101A and a second non-charge transfer region 101B. The portion of the thin layer grown within active region 83 forms the first part 101A, and the portion of the thin layer grown in field oxide region 85B forms the second part.

Figure 18A:
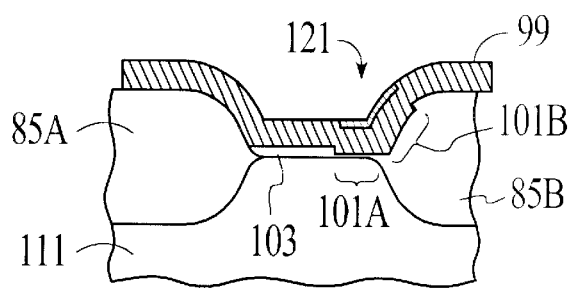
Figure 18B:
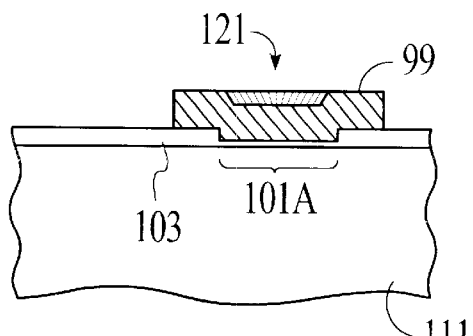

With reference to FIG. 18, first polysilicon layer 99 is then laid over gate oxide 103, oxide window 101, and field oxide region 85A and 85B. First polysilicon layer 99 may be subject to an ion implant before being etched back to only partly extend from field oxide region 85A to 85B. A threshold adjusting implant of preferably 11B+4E11 at 45 KeV and 7 degrees is applied through first polysilicon layer 99 to the channel region to adjust the threshold voltage of the cell.

Figure 19A:
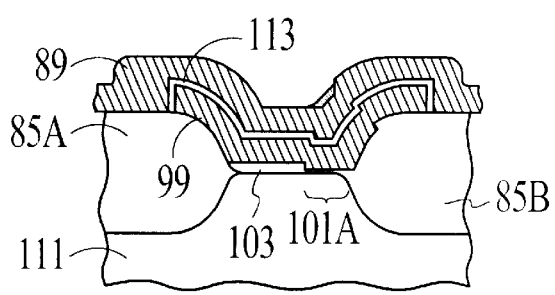
Figure 19B:
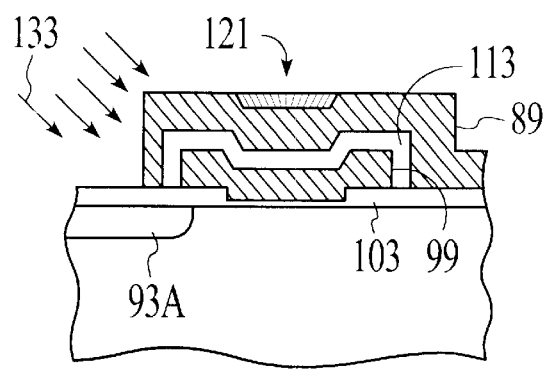

With reference to FIG. 19, an inter-poly oxide 113 is formed to cover the cell. This is followed by the laying of a second polysilicon layer 89 that preferably extends beyond field oxide regions 85A and 85B. This second polysilicon layer 89 will function as the control gate of the floating gate cell, and is likewise subject to an ion implant to adjust its conductivity. Inter-poly oxide 113 separates floating gate polysilicon layer 99 from control gate polysilicon 89. As seen in FIG. 19B, second polysilicon layer may optionally be made to extend beyond the length of first polysilicon layer 99 and rest over substrate 111. In this case, oxide 103 separates second polysilicon layer 89 from substrate 111. Additionally, an optional angle implant 133 may be made in preparation for construction of a lightly doped drain structure.

Figure 20:
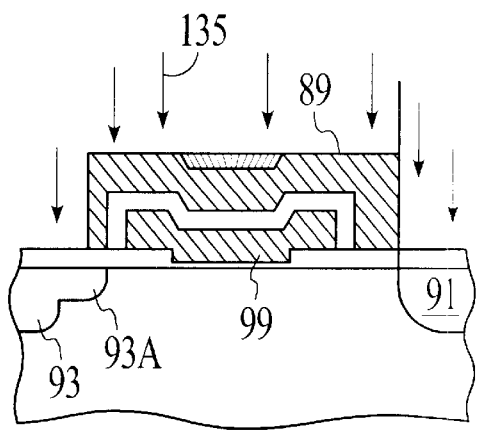
FIG. 20 is a cross-sectional view of a memory cell in accord with a first embodiment of the present invention.
Figure 21:
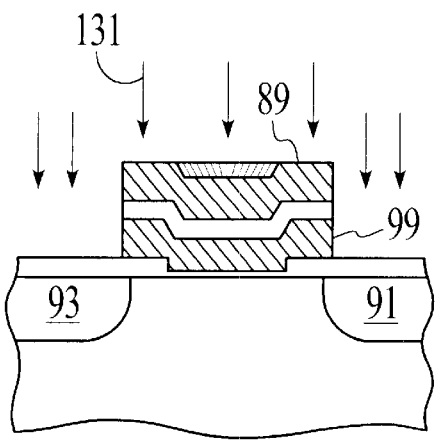
FIG. 21 is a cross-sectional view of a memory cell in accord with a second embodiment of the present invention.

In FIG. 20, source 91 and drain 93 regions are constructed by a vertical implant 135 using control gate 89 and floating gate 99 as a mask. Implant 135 is preferably 31P+4.0E13 at 25 KeV. FIG. 21 shows that if desired the control gate and floating gate may be constructed to align with each other and that the source 91 and drain 93 regions may optionally be constructed with or without a lightly doped drain (LDD) structure (93A for the drain). In this case, both the source 91 and drain 93 are self-aligned to the gate stack consisting of floating gate 99 and control gate 89.

What is claimed is:

1. A method of making a memory cell with a charge transfer region having a dimension smaller than the minimum process feature size defined by the manufacturing equipment used to make said memory cell, said method comprising:

forming field oxide regions having spaced apart, opposed barrier walls defining the width limits of the active area of said memory cell, said field oxide being formed on a substrate of first conductivity type;

constructing a first gate oxide within said active area defined by said opposed field oxide barrier walls;

defining a window region having dimensions equal to said minimum process feature size, said window region being defined to partly encompass said active area and partly encompass only a selected one of said field oxide regions, the part of said window region within said active area being a charge-transfer region and the part of window region within said selected field oxide region being a no-charge-transfer region;

etching away oxide within said defined window region, the amount of oxide etched away being substantially equal to the thickness of said first gate oxide, whereby said substrate is exposed within said window region;

growing a tunnel oxide within both of said charge-transfer and no-charge-transfer regions of said window region, said tunnel oxide being at most half as thick as said first gate oxide;

laying a first polysilicon strip layer over said first gate oxide and extending from one of said field oxide barrier walls to the opposing field oxide barrier wall, said first polysilicon strip partly overlapping both of said opposed field oxide barrier walls, said first polysilicon strip completely covering said charge-transfer region of said window region such that said charge-transfer region does not extend to the boundaries of said first polysilicon strip;

covering said first poly silicon strip layer with at least one dielectric film;

laying a second polysilicon strip layer over said at least one dielectric film and said first polysilicon strip layer, said second polysilicon strip layer extending beyond both of said field oxide region;

applying an ion implant step to construct source and drain regions on either side of said first and second polysilicon strip layers, said drain and source regions being distant from said charge-transfer region of said window region.

2. The method of claim 1 wherein the oxide within said window region is removed by a wet etch step.

3. The method of claim 1 wherein the oxide within said window region is removed by a dry etch step.

4. The method of claim 1 wherein the oxide within said window region is removed by a combination of a wet etch and dry etch step.

5. The method of claim 1 wherein said window region is defined using masks.

6. The method of claim 1 wherein said tunnel oxide is grown within said active area to a thickness less then 80 angstroms.

7. The method of claim 1 wherein said first gate oxide is less than 400 angstroms.

8. The method of claim 1 wherein said first and second polysilicon strips layers are subjected to respective ion implants to make them conductive.

9. The method of claim 1 further including a threshold adjusting ion implant after the laying of said first polysilicon layer strip and prior to the forming of said second gate oxide, said threshold adjusting ion implant being applied to the active area under said first polysilicon strip layer.

10. The method of claim 1 wherein said second polysilicon strip layer is of greater length within said active region than said first polysilicon strip layer, said second polysilicon layer strip extending to cover a side of said first polysilicon strip and to cover a part of said active region.

11. The method of claim 8 further including an ion implant into the substrate along the side of said first polysilicon strip layer not covered by said second polysilicon strip layer, said ion implant being prior to the application of said ion implant step to construct source and drain regions, said ion implant being of lower ion concentration than that used in said ion implant step to construct source and drain regions.

12. A method of making a scalable nonvolatile memory cell, said method comprising:

selecting a scale factor limited by the minimum process feature size defined by the manufacturing equipment used to make said memory cell;

applying said scale factor to a first positive power rail, and applying a larger scale factor to a second positive power rail, said second power rail being about three times greater than said first power rail;

determining the dimensions of a charge-transfer region based on the value of said second positive power rail, the dimensions of said charge-transfer region being smaller than minimum process feature size defined by the manufacturing equipment used to make said memory cell;

forming field oxide regions having spaced apart, opposed barrier walls defining the width limits of the active area of said memory cell, said field oxide being formed on a substrate of first conductivity type;

constructing a first gate oxide within said active area defined by said opposed field oxide barrier walls;

defining a window region having dimensions equal to said minimum process feature size, said window region being defined to partly encompass said active area and partly encompass only a selected one of said field oxide regions, the part of said window region within said active area being said charge-transfer region and the part of window region within said selected field oxide region being a no-charge-transfer region;

etching to remove oxide from within said defined window region, the amount of oxide etched away being substantially equal to the thickness of said first gate oxide, whereby said substrate is exposed within said window region;

growing a tunnel oxide within both of said charge-transfer and no-charge-transfer regions of said window region, said tunnel oxide being at most half as thick as said first gate oxide;

laying a first polysilicon strip layer over said first gate oxide and extending from one of said field oxide barrier walls to the opposing field oxide barrier wall, said first polysilicon strip partly overlapping both of said opposed field oxide barrier walls, said first polysilicon strip completely covering said charge-transfer region of said window region such that said charge-transfer region does not extend to the boundaries of said first polysilicon strip, the length dimension of said first polysilicon strip layer being orthogonal to said width limits of the active area of said memory cell, the length of said polysilicon strip being the base for said selected scale factor;

covering said first poly silicon strip layer with a second gate oxide;

laying a second polysilicon strip layer over said second gate oxide and said first polysilicon strip layer, said second polysilicon strip layer extending beyond both of said field oxide region;

applying an ion implant step to construct source and drain regions on either side of said first and second polysilicon strip layers, said drain and source regions being distant from said charge-transfer region of said window region.

13. The method of claim 12 wherein said window region is defined using masks.

14. The method of claim 12 wherein said tunnel oxide is grown within said active area to a thickness less then 80 angstroms.

15. The method of claim 12 wherein said first gate oxide is less than 400 angstroms.

16. The method of claim 12 wherein said first and second polysilicon strips layers are subjected to respective ion implants to make them conductive.

17. The method of claim 12 further including a threshold adjusting ion implant after the laying of said first polysilicon layer strip and prior to the forming of said second gate oxide, said threshold adjusting ion implant being applied to the active area under said first polysilicon strip layer.

18. The method of claim 12 wherein said second polysilicon strip layer is of greater length within said active region than said first polysilicon strip layer, said second polysilicon layer strip extending to cover a side of said first polysilicon strip and to cover a part of said active region.

19. The method of claim 18 further including an ion implant into the substrate along the side of said first polysilicon strip layer not covered by said second polysilicon strip layer, said ion implant being prior to the application of said ion implant step to construct source and drain regions, said ion implant being of lower ion concentration than that used in said ion implant step to construct source and drain regions.

20. The method of claim 12 wherein said ion implant step to construct source and drain regions is a vertical implant, whereby said source and drain regions are self-aligned to said first and second polysilicon strip layers.

* * * * *